(12) United States Patent
Tsubaki et al.

(10) Patent No.: US 11,631,603 B2
(45) Date of Patent: Apr. 18, 2023

(54) STORAGE SHELF, AND METHOD FOR INSTALLING STORAGE SHELF

(71) Applicant: MURATA MACHINERY, LTD., Kyoto (JP)

(72) Inventors: Tatsuo Tsubaki, Ise (JP); Shinji Onishi, Ise (JP)

(73) Assignee: MURATA MACHINERY, LTD., Kyoto (JP)

( * ) Notice: Subject to any disclaimer, the term of this patent is extended or adjusted under 35 U.S.C. 154(b) by 137 days.

(21) Appl. No.: 17/259,220

(22) PCT Filed: May 15, 2019

(86) PCT No.: PCT/JP2019/019322
§ 371 (c)(1),
(2) Date: Jan. 11, 2021

(87) PCT Pub. No.: WO2020/017137
PCT Pub. Date: Jan. 23, 2020

(65) Prior Publication Data
US 2021/0272830 A1    Sep. 2, 2021

(30) Foreign Application Priority Data

Jul. 20, 2018    (JP) .............................. JP2018-136927

(51) Int. Cl.
*H01L 21/673*    (2006.01)
*H01L 21/677*    (2006.01)

(52) U.S. Cl.
CPC .. *H01L 21/67383* (2013.01); *H01L 21/67733* (2013.01); *H01L 21/67769* (2013.01)

(58) Field of Classification Search
CPC ......... H01L 21/67383; H01L 21/67733; H01L 21/67769; H01L 21/67389; H01L 21/6773;

(Continued)

(56) References Cited

U.S. PATENT DOCUMENTS 6,202,966 B1 *  3/2001  MacDonald ......... A47B 57/425
                                                          248/247
2009/0120320 A1   5/2009  Kato
(Continued)

FOREIGN PATENT DOCUMENTS

JP    2008-247561 A    10/2008
JP    2009-120299 A     6/2009
(Continued)

OTHER PUBLICATIONS

Official Communication issued in International Patent Application No. PCT/JP2019/019322, dated Jun. 25, 2019.

(Continued)

*Primary Examiner* — Glenn F Myers
(74) *Attorney, Agent, or Firm* — Keating & Bennett, LLP (57) ABSTRACT

A storage shelf includes second shelf modules each including a second shelf board, a supply nozzle, an MFC configured to adjust a flow rate of the fluid supplied from the supply nozzle, and a third pipe connecting between the MFC and a main pipe connected to a supply source of the fluid, and suspension frames each including additional shelf supporting portions supporting the second shelf modules from below and a pair of suspending portions and a pair of additional suspending portions suspending and supporting the additional shelf supporting portions. The suspension frames are disposed at regular intervals along one direction. Each second shelf module is laid over between additional shelf supporting portions of suspension frames adjacent to each other in the one direction, and a pipe connector being connectable to the main pipe is provided with an end of the third pipe.

6 Claims, 9 Drawing Sheets

(58) Field of Classification Search
CPC ......... B65G 1/00; B65G 1/0464; F24F 7/065;
F24F 7/04; F24F 11/72; F24F 11/74;
B08B 5/02
USPC .............. 414/267, 287; 454/57, 58; 248/317
See application file for complete search history.

(56) References Cited

U.S. PATENT DOCUMENTS

| | | |
|---|---|---|
| 2015/0235884 A1 | 8/2015 | Jang et al. |
| 2016/0184873 A1* | 6/2016 | Lee .................... B08B 15/02 |
| | | 454/56 |
| 2017/0278736 A1* | 9/2017 | Iwasaki ................ H01L 21/54 |
| 2019/0217873 A1 | 7/2019 | Imahori |
| 2020/0180864 A1* | 6/2020 | Tsubaki ........... H01L 21/67389 |
| 2020/0227295 A1 | 7/2020 | Murata et al. |

FOREIGN PATENT DOCUMENTS

| | | |
|---|---|---|
| JP | 2015-533026 A | 11/2015 |
| TW | 200903694 A | 1/2009 |
| TW | 201814817 A | 4/2018 |
| WO | 2017/038269 A1 | 3/2017 |

OTHER PUBLICATIONS

English translation of Official Communication issued in International Patent Application No. PCT/JP2019/019322, dated Feb. 4, 2021 and Jun. 25, 2019.
Official Communication issued in corresponding Taiwanese Patent Application No. 108125473, dated Oct. 31, 2022.

* cited by examiner

STORAGE SHELF, AND METHOD FOR INSTALLING STORAGE SHELF

BACKGROUND OF THE INVENTION

1. Field of the Invention

The present invention relates to a storage shelf and a method for installing a storage shelf.

2. Description of the Related Art

Known in the art are storage shelves configured to store containers such as a front-opening unified pod (FOUP) configured to accommodate wafers to be processed in a semiconductor manufacturing device or a liquid crystal manufacturing device, for example, and a reticle pod configured to accommodate reticles to be used in the semiconductor manufacturing device or the liquid crystal manufacturing device, for example. For example, Japanese Unexamined Patent Publication No. 2009-120299 discloses a storage shelf installed so as to be suspended from a supported member of a track for overhead traveling vehicles or a ceiling, for example. In the storage shelf in Japanese Unexamined Patent Publication No. 2009-120299, posts for suspending a shelf board on which a container is to be placed are not fixed to the ceiling, and are fixed instead to beams laid over and extending between tracks for overhead traveling vehicles that extend side by side. Thus, the number of members, such as hanger bolts, can be reduced, and the work of installing the shelf board can be simplified.

SUMMARY OF THE INVENTION

Recently, with an increase in the variety of methods of processing stored objects, requirements for a layout of a storage shelf such as the number of shelf boards in the storage shelf and the installation position thereof have become diverse. Even in this situation, it is required that the storage shelf can be installed easily at a site.

Preferred embodiments of the present invention provide storage shelves and methods for installing storage shelves that each enable installation work at a site to be performed easily.

A storage shelf according to one aspect of a preferred embodiment of the present invention includes a shelf module including a shelf board on which a container is to be placed, a nozzle to supply fluid into the container placed on the shelf board, a mass flow controller to adjust the flow rate of the fluid supplied from the nozzle, and a pipe connecting between the mass flow controller and a main pipe connected to a supply source of the fluid, and suspension frames each including a shelf supporting portion supporting the shelf module from below and a pair of suspending portions suspending and supporting the shelf supporting portion. The suspension frames are disposed at regular intervals along one direction. The shelf module is laid over between the shelf supporting portions of the suspension frames adjacent to each other in the one direction, and an end of the pipe is provided with a pipe connector being connectable to the main pipe.

The storage shelf is installed by simple steps of disposing the suspension frames at regular intervals along a traveling direction, laying the shelf module over between the shelf supporting portions of the suspension frames adjacent to each other, and fastening together the shelf supporting portions and the shelf module. Because the end of the pipe is provided with the pipe connector being connectable to the main pipe, the pipe can be easily connected to the main pipe. Consequently, installation work at a site is facilitated.

In a storage shelf according to one aspect of a preferred embodiment of the present invention, the shelf module may be fixed to the shelf supporting portions by bolts or screws inserted from below into through holes formed in the shelf supporting portions. In a state in which the suspension frames are fixed to a fixed structure such as a ceiling and the shelf module is laid over between the shelf supporting portions of the adjacent suspension frames, a space for an operator to access an area above a shelf module is limited. Even in this state, in the storage shelf according to this aspect of a preferred embodiment of the present invention, the work of fixing the shelf module to the suspension frames can be performed from below the suspension frames, which facilitates the installation work at the site.

A storage shelf according to one aspect of a preferred embodiment of the present invention includes a shelf module including a shelf board on which a container is to be placed, a nozzle to supply fluid into the container placed on the shelf board, a mass flow controller to adjust the flow rate of the fluid supplied from the nozzle, and a pipe connecting between the mass flow controller and a main pipe connected to a supply source of the fluid, and suspension frames each including a shelf supporting portion supporting the shelf module from below and a pair of suspending portions suspending and supporting the shelf supporting portion. The suspension frames are disposed at regular intervals along one direction. The shelf module is laid over between the shelf supporting portions of the suspension frames adjacent to each other in the one direction, and the shelf module laid over between the shelf supporting portions is fixed to the shelf supporting portions of the suspension frames by bolts or screws inserted from below into through holes in the shelf supporting portions.

The shelf module is laid over between the shelf supporting portions of the suspension frames adjacent to each other in the one direction, and the shelf module laid over between the shelf supporting portions is fixed to the shelf supporting portions of the suspension frames by the bolts or the screws inserted from below into the through holes in the shelf supporting portions. In a state in which the suspension frames have been fixed to a fixed structure such as a ceiling and the shelf module has been laid over between the shelf supporting portions of the adjacent suspension frames, a space for the operator to access an area above the shelf module is limited. Even in this state, in the storage shelf according to this aspect of a preferred embodiment of the present invention, the work of fixing the shelf module to the suspension frames can be performed from below the suspension frames, which facilitates the installation work at the site.

In a storage shelf according to one aspect of a preferred embodiment of the present invention, the shelf module may include a shelf frame laid over between the shelf supporting portions of the suspension frames adjacent to each other in the one direction and a plurality of shelf boards attached to the shelf frame, and the mass flow controller may be disposed on each of the shelf boards. With this configuration, even when the shelf boards each having a purge function are provided, a pipe can be provided in advance to the shelf module, which facilitates the installation work at the site.

In a storage shelf according to one aspect of a preferred embodiment of the present invention, the shelf module may further include a cable one end of which is connected to each mass flow controller, and the other end of the cable may be provided with a cable connector being connectable to a main cable connected to a control device. With this configuration, the cable to connect the mass flow controller to the control device can be easily connected to the main cable, which facilitates the installation work at the site.

In a storage shelf according to one aspect of a preferred embodiment of the present invention, the shelf module structured such that the number of the branch connecting portions corresponds to the number of the shelf boards may be provided with branch connecting portions each being connectable between the main pipe and the pipe. With this configuration, the work of attaching the pipe branching off from the main pipe can be performed easily.

A storage shelf according to one aspect of a preferred embodiment of the present invention is a storage shelf in which a shelf module, which extends along a track for an overhead traveling vehicle to convey a container and on which the container is to be placed, is suspended by a suspension frame from a fixed structure. The storage shelf includes at least one shelf module selected from among two types of shelf modules the lengths of which in an extending direction are the same and the types of which are different in the presence or absence of a purge function, and a plurality of the suspension frames each including shelf supporting portions supporting the shelf module from below and extending in one direction and a pair of suspending portions extending from both ends of each shelf supporting portion to the fixed structure, the suspension frames being selected from among a plurality of types of suspension frames the lengths of which in extending directions of the shelf supporting portion and the suspending portions are different from each other. The suspension frames are disposed at regular intervals along a traveling direction of the overhead traveling vehicle such that the extending direction of the shelf supporting portion extends in a direction orthogonal to the traveling direction. The shelf module is laid over between the shelf supporting portions of the suspension frames adjacent to each other in the traveling direction, and the shelf module laid over between the shelf supporting portions is fixed to the shelf supporting portions of the suspension frames by fastening members.

A method for installing a storage shelf according to one aspect of a preferred embodiment of the present invention is a method for installing a storage shelf in which a shelf module, which extends along a track for an overhead traveling vehicle to convey a container and on which the container is to be placed, is suspended by a suspension frame from a fixed structure. The method includes a step of selecting at least one shelf module selected from among two types of shelf modules the lengths of which in an extending direction are the same and the types of which are different in the presence or absence of a purge function, a step of selecting a plurality of the suspension frames each including shelf supporting portions supporting the shelf module from below and extending in one direction and a pair of suspending portions extending from both ends of each shelf supporting portion to the fixed structure, the suspension frames being selected from among a plurality of types of suspension frames the lengths of which in extending directions of the shelf supporting portion and the suspending portions are different from each other, a step of disposing the selected suspension frames at regular intervals along a traveling direction of the overhead traveling vehicle such that the extending direction of the shelf supporting portion extends in a direction orthogonal to the traveling direction, a step of laying the selected shelf module over between shelf supporting portions of the suspension frames adjacent to each other in the traveling direction, and a step of fixing the shelf module laid over between the shelf supporting portions to the shelf supporting portions of the suspension frames by fastening members.

In the storage shelf thus configured and the method for installing the storage shelf, the storage shelf is installed by the simple steps of disposing the suspension frames at regular intervals along the traveling direction, laying the shelf module over between the shelf supporting portions of the adjacent suspension frames, and fastening the shelf module to the shelf supporting portions. Thus, the installation work at the site is facilitated. Furthermore, the suspension frames can be selected from a suspension frame group including a plurality of types in which the lengths of the shelf supporting portions and the suspending portions are different from each other. Thus, for example, the storage shelf can be installed along one track, the storage shelf can be installed along two tracks that extend side by side, and the storage shelf can be installed along tracks in which these arrangements coexist. Consequently, layout changes after the installation can be performed easily.

According to preferred embodiments of the present invention, the installation work at a site is able to be performed easily.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will now be described in detail with reference to the drawings. In the description of the drawings, like elements are designated by like reference signs, and duplicate description is omitted. The terms "X-direction", "Y-direction", and "Z-direction" are based on directions illustrated in the drawings and are given for convenience.

Figure 1:
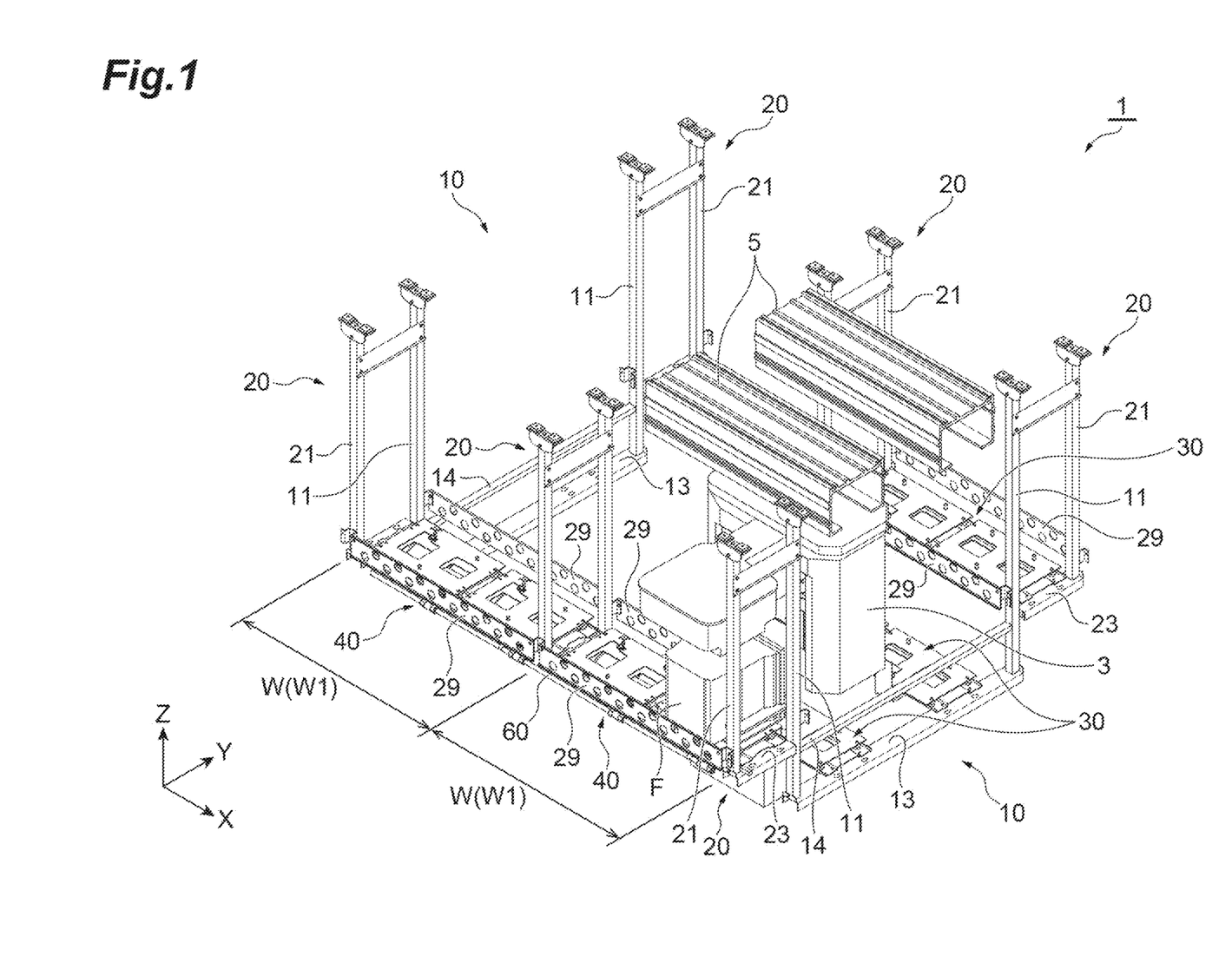
FIG. 1 is a perspective view illustrating a storage shelf according to a preferred embodiment of the present invention.

A storage shelf 1 illustrated in FIG. 1 is installed along tracks 5 for overhead traveling vehicles 3 included in a semiconductor conveyance system of a semiconductor manufacturing plant, for example. The storage shelf 1 temporarily stores therein a container F such as a FOUP or a reticle pod. The storage shelf includes suspension frames 10, first shelf modules (shelf modules) 30, second shelf modules (shelf modules) 40, main pipes 60, and main cables 70 (see FIG. 5).

Figure 2:
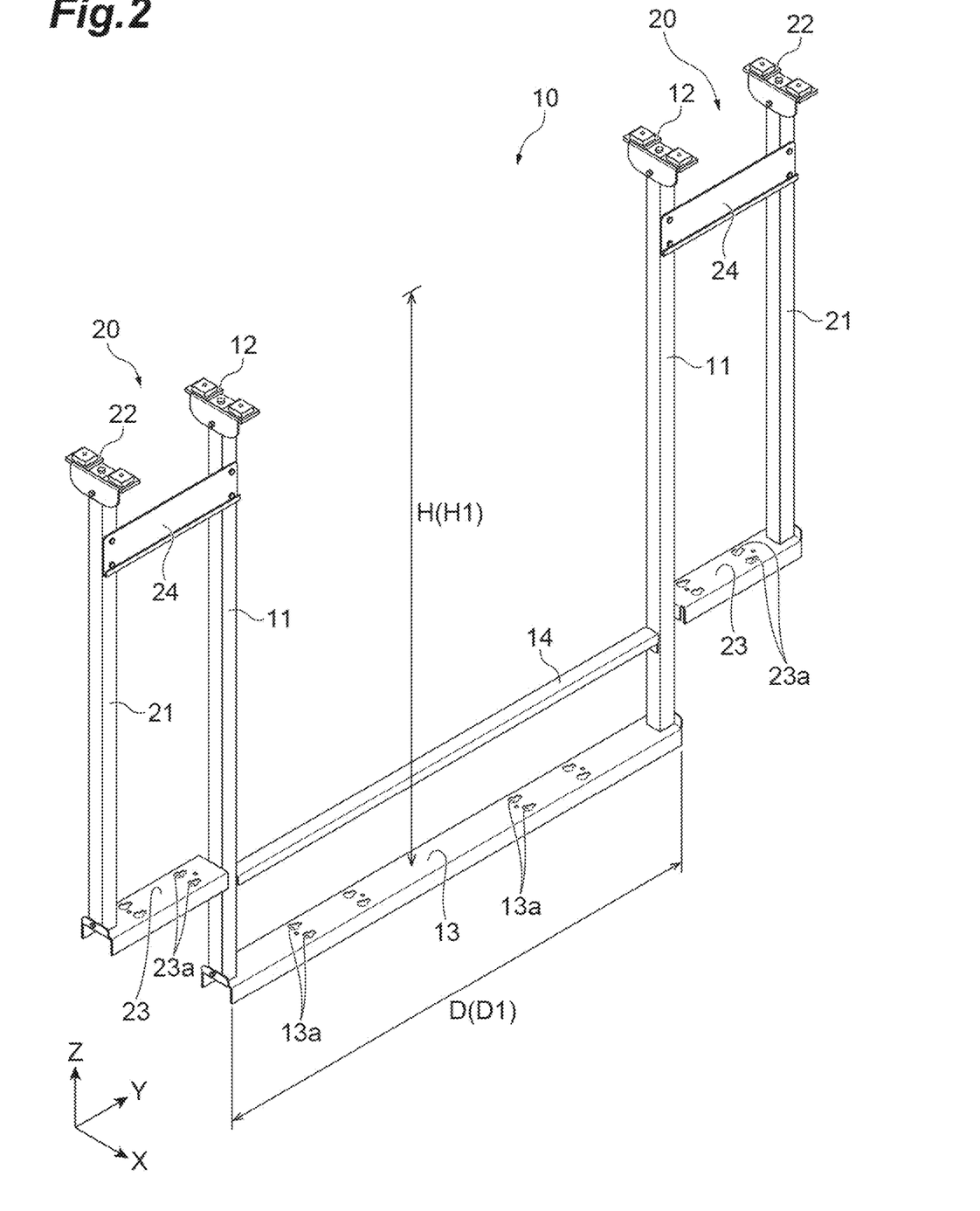
FIG. 2 is a perspective view illustrating a suspension frame in FIG. 1.

As illustrated in FIG. 1 and FIG. 2, the suspension frames 10 suspend the first shelf modules 30 from a ceiling. The suspension frames 10 are arranged at regular intervals W1 along the extending direction (X-direction) of the tracks 5.

Each suspension frame 10 includes a shelf supporting portion 13, a pair of suspending portions 11, 11, and a connecting portion 14. The shelf supporting portion 13 extends along the short-side direction (Y-direction) of the first shelf modules 30 or the second shelf modules 40, and supports the first shelf modules 30 or the second shelf modules 40 from below. The depth length D, which is a length in the longitudinal direction (Y-direction), of the shelf supporting portion 13 is D1. The pair of suspending portions 11, 11 extend in the suspended direction (Z-direction) from both ends of the shelf supporting portion 13 to fixation portions 12 to be fixed to a ceiling (fixed structure). The suspended length H, which is a length in the suspended direction, of each suspending portion 11 is H1. The connecting portion 14, both ends of which are connected to the pair of suspending portions 11, 11, extends parallel to the shelf supporting portion 13 (in the Y-direction).

To the suspension frame 10, additional units 20 are fixed. Each additional unit 20 is fixed to the corresponding suspending portion 11 of the suspension frame 10, and is additionally attached to the suspension frame 10. The additional unit 20 includes an additional shelf supporting portion 23, an additional suspending portion 21, an additional connecting portion 24, and fall prevention fences 29. The additional shelf supporting portion 23 extends along the short-side direction (Y-direction) of the first shelf modules 30 or the second shelf modules 40, and supports the corresponding first shelf module 30 or the corresponding second shelf module 40 from below. The additional suspending portion 21 extends in the suspended direction (Z-direction) from one end of the additional shelf supporting portion 23 to a fixation portion 22 to be fixed to the ceiling. The additional connecting portion 24, one end of which is connected to the additional suspending portion 21 and the other end of which is connected to the suspending portion 11, extends parallel to the additional shelf supporting portion 23 (in the Y-direction). Each fall prevention fence 29 is a plate-shaped member that is laid over between adjacent suspending portions 11, or between adjacent additional suspending portions 21. The fall prevention fences 29 are disposed so as to sandwich a container F placed on the first shelf module 30 or the second shelf module 40 laterally (in the Y-direction).

The first shelf module 30 and the second shelf module 40 are each a member on which a container F is to be placed. The first shelf module 30 and the second shelf module 40, the length W of which in the longitudinal direction (X-direction) is W1, are laid over between adjacent suspension frames 10. Specifically, the first shelf module 30 and the second shelf module 40 are laid over between adjacent shelf supporting portions 13, or between adjacent additional shelf supporting portions 23.

Figure 3:
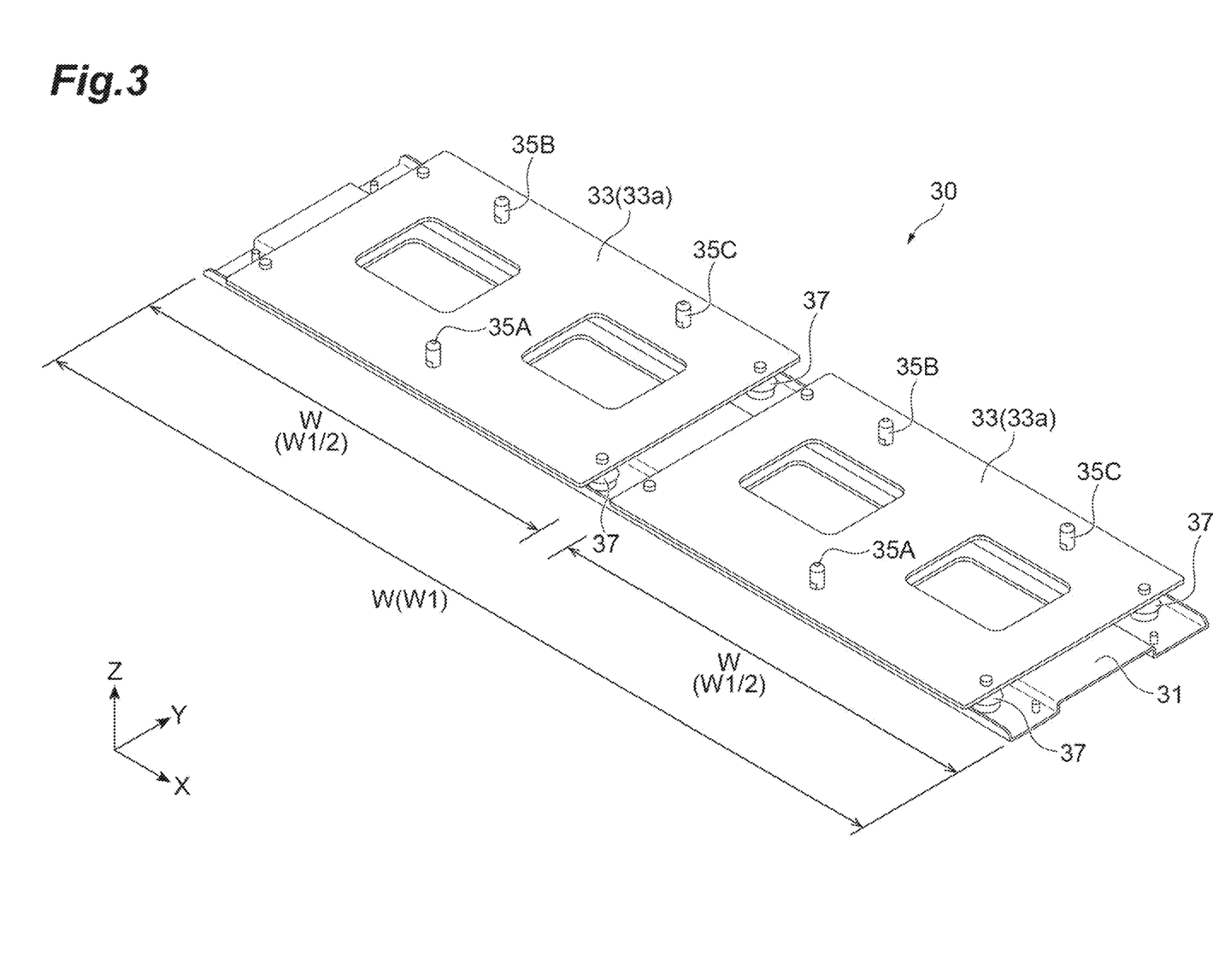
FIG. 3 is a perspective view of a first shelf module in FIG. 1 when viewed from above.

In the present preferred embodiment, between adjacent additional shelf supporting portions 23 of additional units 20 on one side, a first shelf module 30 as illustrated in FIG. 3 is laid over. The first shelf module 30 is a unit without a purge function, that is, a unit without a function of supplying gas to a container F placed thereon. Examples of the gas include nitrogen gas and dry air.

Figure 4:
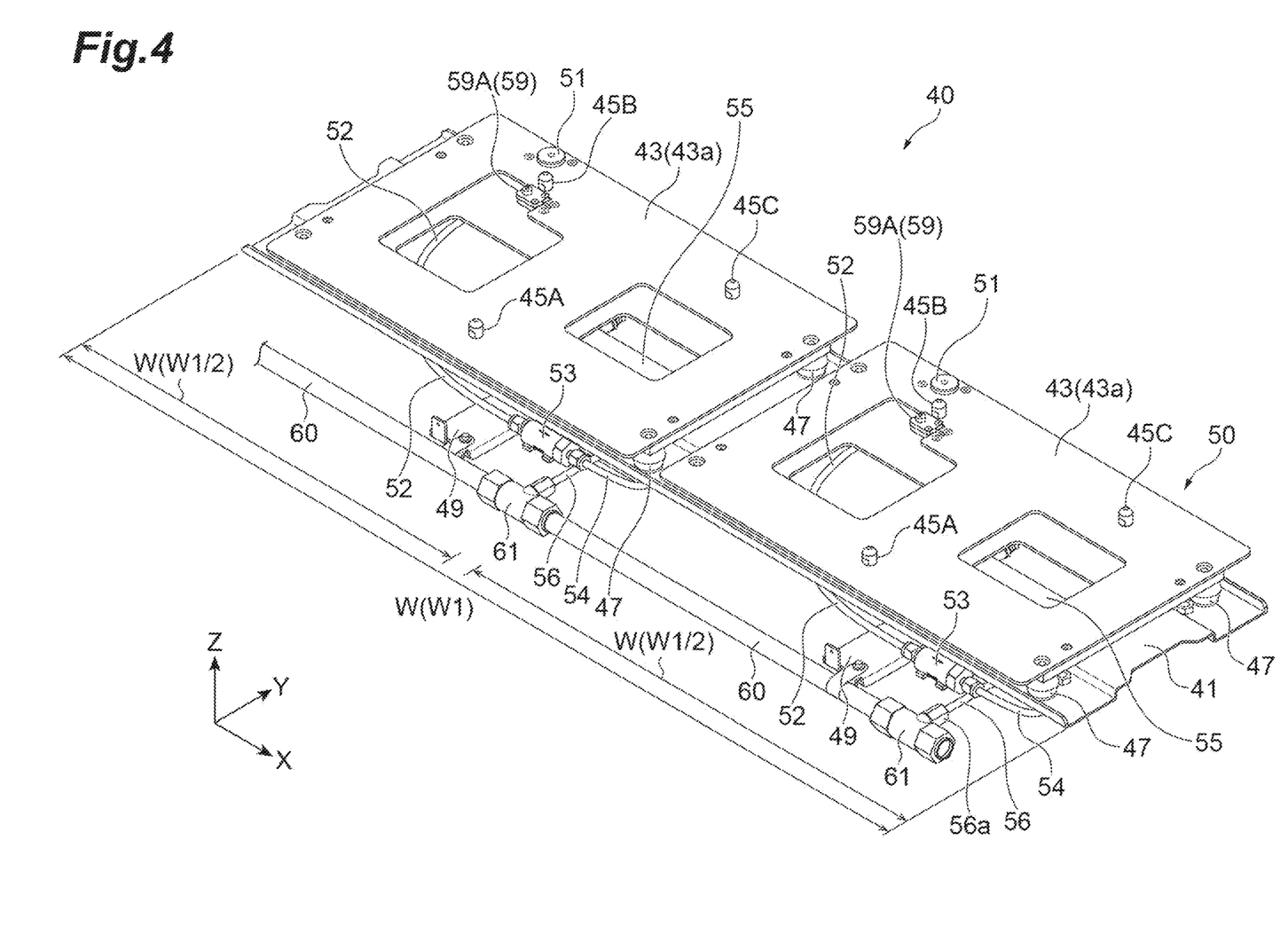
FIG. 4 is a perspective view of a second shelf module in FIG. 1 when viewed from above.

In the present preferred embodiment, between adjacent shelf supporting portions 13 of suspension frames 10, a second shelf module 40 as illustrated in FIG. 4 is laid over. The second shelf module 40 is a unit having the purge function, that is, a unit having the function of supplying gas to a container F placed thereon. Furthermore, in the present preferred embodiment, between adjacent additional shelf supporting portions 23 of additional units 20 on the other side, a first shelf module 30 as illustrated in FIG. 3 is laid over.

The following describes the first shelf module 30 illustrated in FIG. 3. The first shelf module 30 includes a first shelf frame (shelf frame) 31 and first shelf boards (shelf boards) 33. The first shelf frame 31 is laid over between shelf supporting portions 13 or additional shelf supporting portions 23 adjacent to each other in the X-direction. The first shelf frame 31 is a plate-shaped member having a rectangular or substantially rectangular shape in plan view when viewed from the Z-direction. The length W of the first shelf frame 31 in the longitudinal direction (X-direction) is W1. The first shelf frame 31 is fixed to the shelf supporting portions 13 or the additional shelf supporting portions 23 by screws (fastening members) 19 inserted from below into the shelf supporting portions 13 or the additional shelf supporting portions 23 as illustrated in FIG. 2. More specifically, the first shelf frame 31 is fixed to the shelf supporting portions 13 or the additional shelf supporting portions 23 by the screws 19 inserted from below into through holes 13a or 23a provided in the shelf supporting portions 13 or the additional shelf supporting portions 23. Instead of the screws 19, bolts and nuts may be used.

The first shelf boards 33 are supported on upper surfaces of the first shelf frame 31 with elastic bodies 37 interposed therebetween. Each first shelf board 33 is a plate-shaped member having a rectangular or substantially rectangular shape in plan view when viewed from the Z-direction. The length W of the first shelf board 33 in the longitudinal direction (X-direction) is substantially half (W½) of the length W1 of the first shelf frame 31. In other words, two first shelf boards 33 are arranged along the X-direction in the first shelf frame 31. Examples of the elastic bodies 37 include rubber materials, silicone gel materials, urethan gels, and metal springs. Each first shelf board 33 has a placement surface 33a on which a container F is to be placed, and pins 35A, 35B, 35C are provided on the placement surface 33a. The pins 35A, 35B, 35C protrude upward from the placement surface 33a of the first shelf board 33. The pins 35A, 35B, 35C are arranged at positions corresponding to positioning holes (not illustrated) in a bottom portion of the container F.

Figure 5:
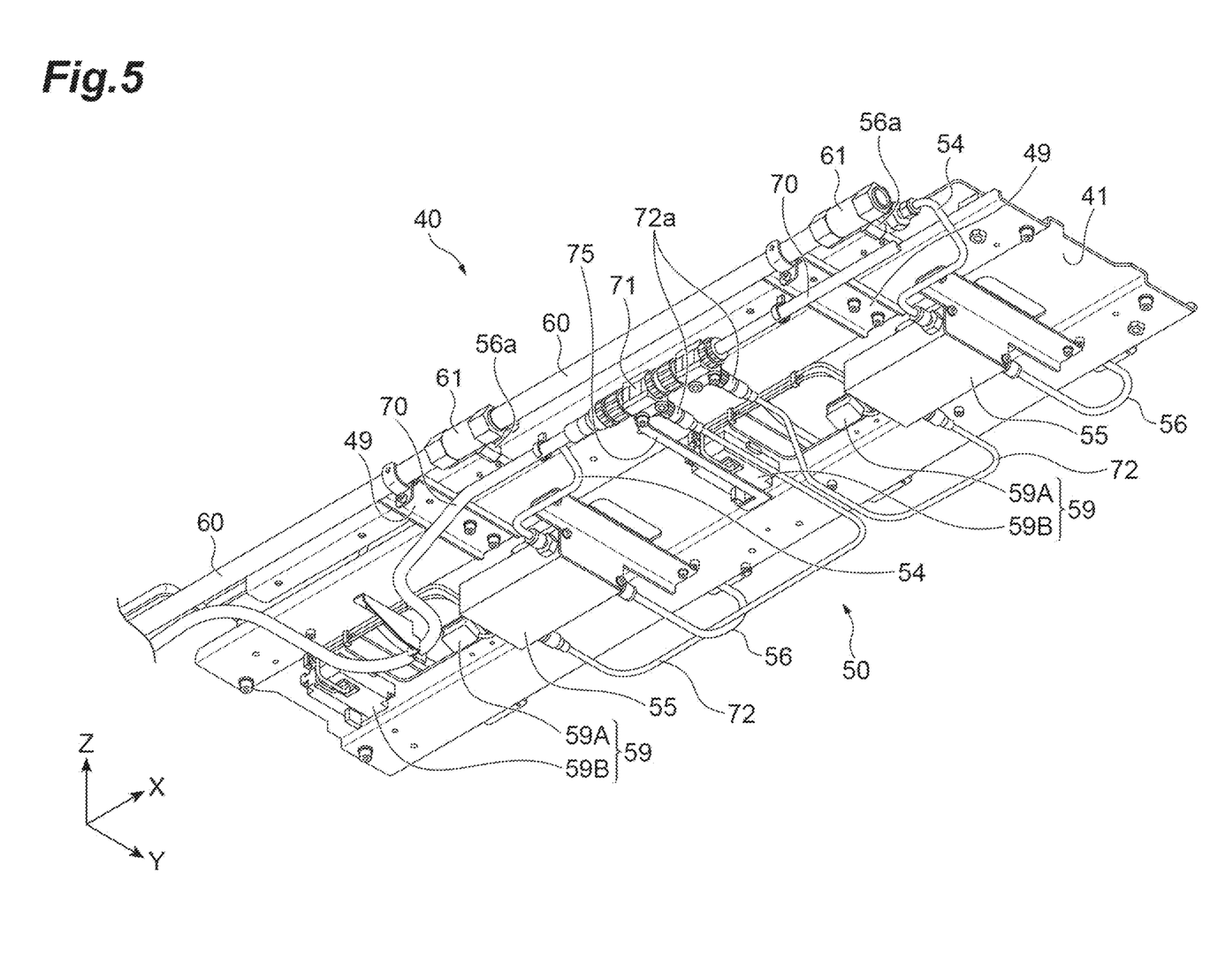
FIG. 5 is a perspective view of the second shelf module in FIG. 1 when viewed from below.

The following describes the second shelf module 40 illustrated in FIG. 4 and FIG. 5. The second shelf module 40 includes a second shelf frame (shelf frame) 41, second shelf boards (shelf boards) 43, and a purge apparatus 50. The second shelf frame 41 is laid over between additional shelf supporting portions 23 adjacent to each other in the X-direction. The second shelf frame 41 is a plate-shaped member having a rectangular or substantially rectangular shape in plan view when viewed from the Z-direction. The length W of the second shelf frame 41 in the longitudinal direction (X-direction) is W1, which is the same as that of the first shelf frame 31.

The second shelf boards 43 are supported on upper surfaces of the second shelf frame 41 with elastic bodies 47 interposed therebetween. Each second shelf board 43 is a plate-shaped member having a rectangular or substantially rectangular shape in plan view when viewed from the Z-direction. The length W of the second shelf board 43 in the longitudinal direction is substantially half (W½) of the length W1 of the second shelf frame 41. In other words, two second shelf boards 43 are arranged along the X-direction in the second shelf frame 41. The material of the elastic bodies 47 are the same as that of the elastic bodies 37.

Each second shelf board 43 includes a placement surface 43a on which a container F is to be placed, and pins 45A, 45B, 45C are provided on the placement surface 43a. The pins 45A, 45B, 45C protrude upward from the placement surface 43a of the second shelf board 43. The pins 45A, 45B, 45C are arranged at positions corresponding to the positioning holes (not illustrated) provided in the bottom portion of the container F.

The purge apparatus 50 includes supply nozzles 51, first pipes 52, filter units 53, second pipes 54, mass flow controllers (MFC) 55, third pipes (pipes) 56, and detection units 59. Each supply nozzle 51 is a nozzle configured to supply gas into a container F. The supply nozzle 51 protrudes upward from the placement surface 43a of the corresponding second shelf board 43, and is connected to an introduction hole in the bottom surface of the container F by placing the container F onto the supply nozzle 51.

Each first pipe 52 is a tubular member connecting between the corresponding supply nozzle 51 and the corresponding filter unit 53. The filter unit 53 is a member in which a filter configured to remove foreign matters contained in gas passing through the filter unit 53 is accommodated, and removes foreign matters contained in gas supplied from a supply source of the gas via the corresponding main pipe 60. The filter unit 53 is fixed to the second shelf frame 41 by an appropriate member. Each second pipe 54 is a tubular member connecting between the corresponding filter unit 53 and the corresponding MFC 55.

Each MFC 55 measures the flow rate of gas supplied from the corresponding main pipe 60 and controlling the flow rate. The MFC 55 is controlled by a purge controller (not illustrated). The MFC 55 is provided on each of the second shelf boards 43, and the MFC 55 is connected, via the corresponding cable 72, to the corresponding main cable 70 connected to the purge controller. The cable 72 is connected to a branch portion 71 of the main cable 70. To the cable 72 at its end to be connected to the branch portion 71, a cable connector 72a being connectable to the branch portion 71 is provided. The purge controller controls the MFC 55 such that, if a container F has been detected by the corresponding detection unit 59, a predetermined flow rate of gas is supplied to the container F, and controls the MFC 55 such that, if a container F has not been detected by the detection unit 59, the gas is not supplied to the container F. The MFC 55 is fixed to a lower surface of the second shelf frame 41 by an appropriate method.

Each third pipe 56 is a tubular member connecting between the corresponding MFC 55 and a branch portion (branch connecting portion) 61. To the third pipe 56 at its end to be connected to the branch portion 61, a pipe connector 56a being connectable to the branch portion 61 is provided.

Each detection unit 59 detects whether a container F has been placed on the corresponding second shelf board 43. The detection unit 59 is provided on the placement surface 43a of the second shelf board 43. The detection unit 59 includes a load sensor 59A and a processing unit 59B. The detection unit 59 is controlled by the purge controller (not illustrated). The detection unit 59 is connected, via the corresponding cable 75, to the corresponding main cable 70 connected to the purge controller. The cable 75 is connected to the branch portion 71 of the main cable 70.

The main pipes 60 are connected to the supply source of gas to be supplied to the purge apparatus 50. Each main pipe 60 is a tubular member made of metal such as stainless steel or resin such as a fluorocarbon polymer. The main pipe 60 is supported by a pipe support bracket 49 fixed to the second shelf frame 41. The main pipe 60 includes the corresponding branch portion 61. To the branch portion 61, the corresponding third pipe 56 included in the purge apparatus 50 is connected.

The main cables 70 are connected to the purge controller configured or programmed to control a plurality of the purge apparatuses 50 in an integrated manner. The purge controller may be fixed to a portion of the storage shelf 1, for example, or may be provided in a location separate from the storage shelf 1 via a relay device, for example. Each main cable 70 is fixed to a lower surface of the corresponding second shelf board 43. The main cable includes the corresponding branch portion 71. The cable 72 connected to the corresponding MFC 55 and the cable 75 connected to the corresponding detection unit 59 are connected to the branch portion 71.

The following describes a procedure for installing the storage shelf 1 according to the present preferred embodiment at the site (a method for installing the storage shelf). Suspension frames are selected from a suspension frame group including a plurality of types of suspension frames 10 the lengths D of which in the extending direction of the shelf supporting portions 13 and the lengths H of which in the extending direction of the suspending portions 11 are different from each other. The suspension frames used in the present preferred embodiment are selected from a suspension frame group including three types of suspension frames 10, 10A, 10B the lengths D (D1, D2, D3) of which and the lengths H (H1, H2) of which are different from each other as illustrated in FIGS. 6A to 6C.

Figure 6A:
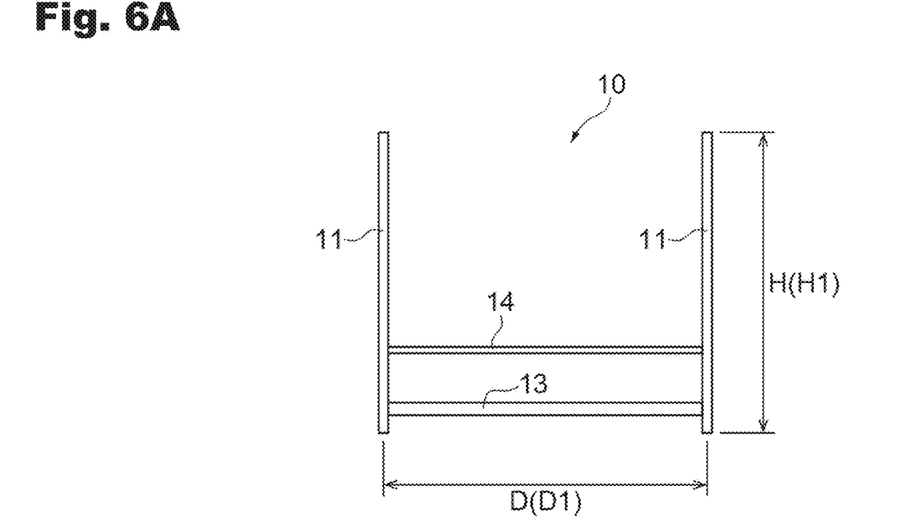
FIGS. 6A to 6C are front views illustrating patterns of suspension frames included in a suspension frame group.
Figure 6B:
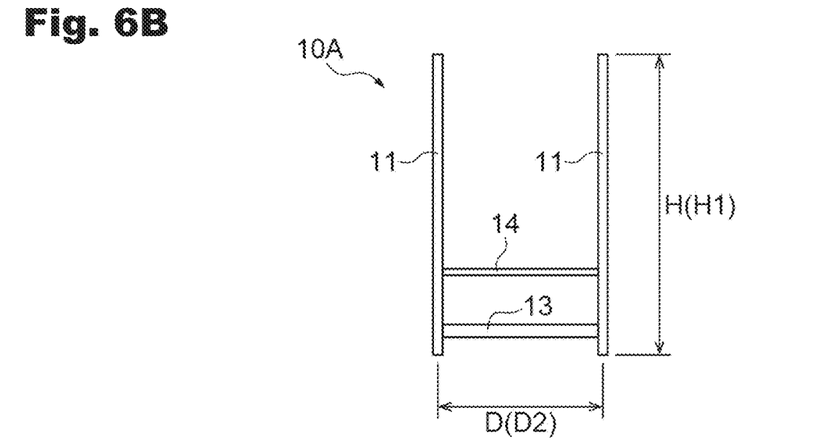
Figure 6C:
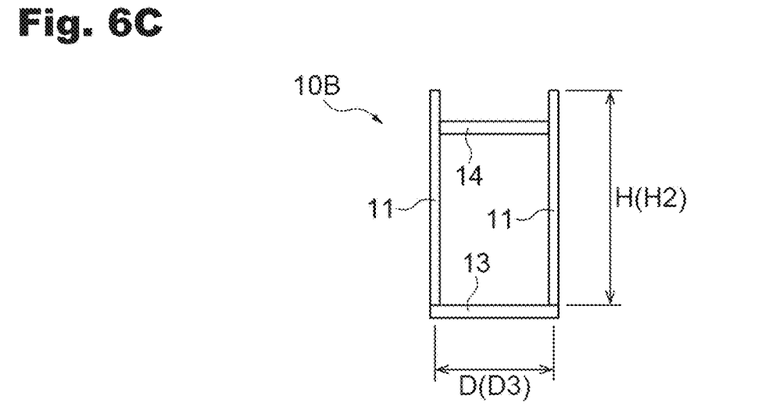

In the present preferred embodiment, from the above-described suspension frame group, three suspension frames 10 having the length D (D1) and the length H (H1) illustrated in FIG. 6A are selected. The suspension frame 10 illustrated in FIG. 6A is suspended in a manner extending across two tracks 5 running side by side and is used to place a container F below each of the two tracks 5. Herein, the suspension frame 10A illustrated in FIG. 6B is suspended in a manner extending across one track 5 and is used to place a container F along the track 5 below the track 5. The suspension frame 10B illustrated in FIG. 6C is a member that is suspended beside one track 5 and is used to place a container F along the track 5 beside the track 5.

Figure 7A:
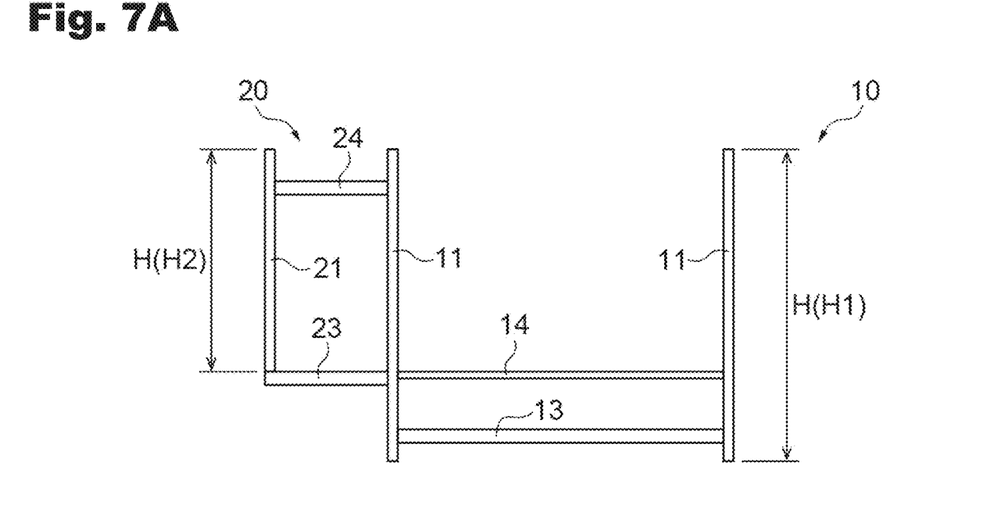
FIGS. 7A to 7C are front views illustrating patterns of a suspension frame to which additional units are fixed.
Figure 7B:
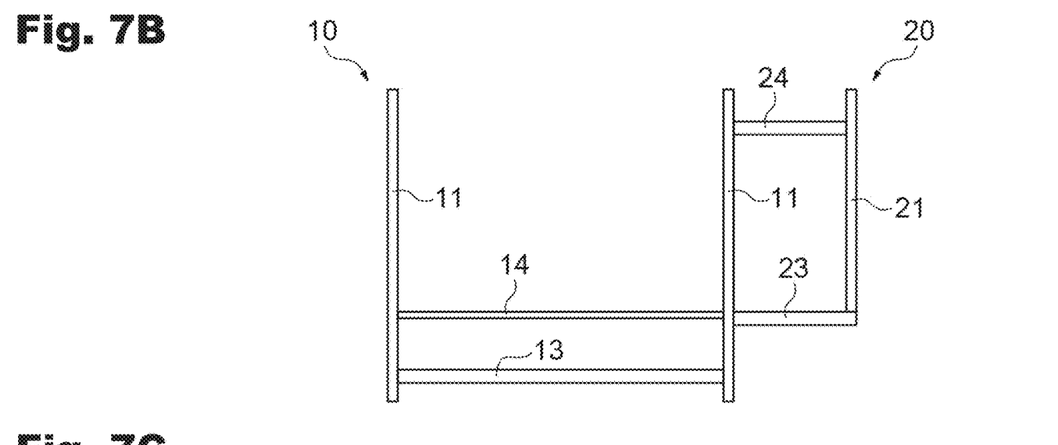
Figure 7C:
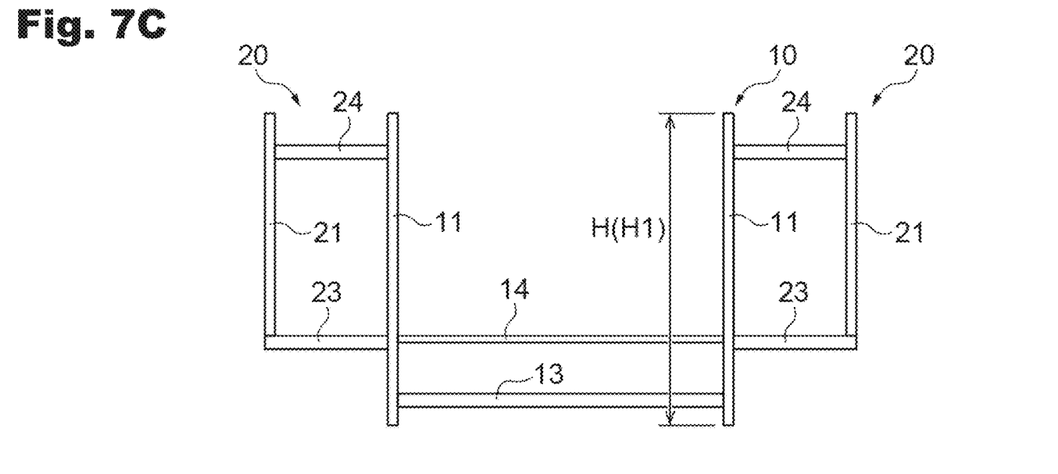
Figure 8A:
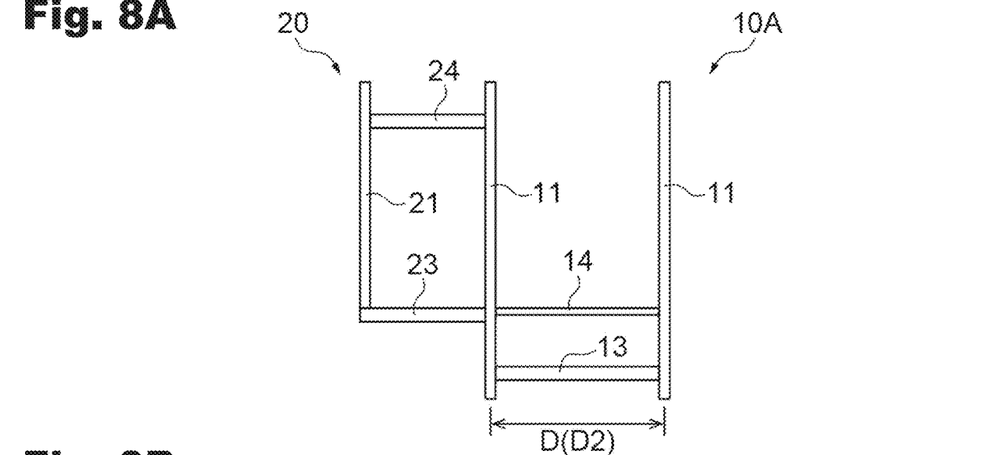
FIGS. 8A to 8C are front views illustrating patterns of another suspension frame to which additional units are fixed.
Figure 8B:
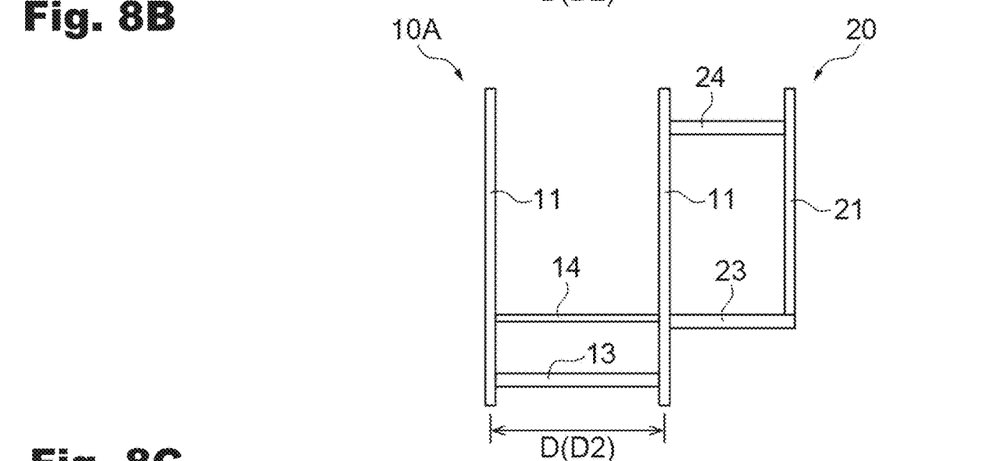
Figure 8C:
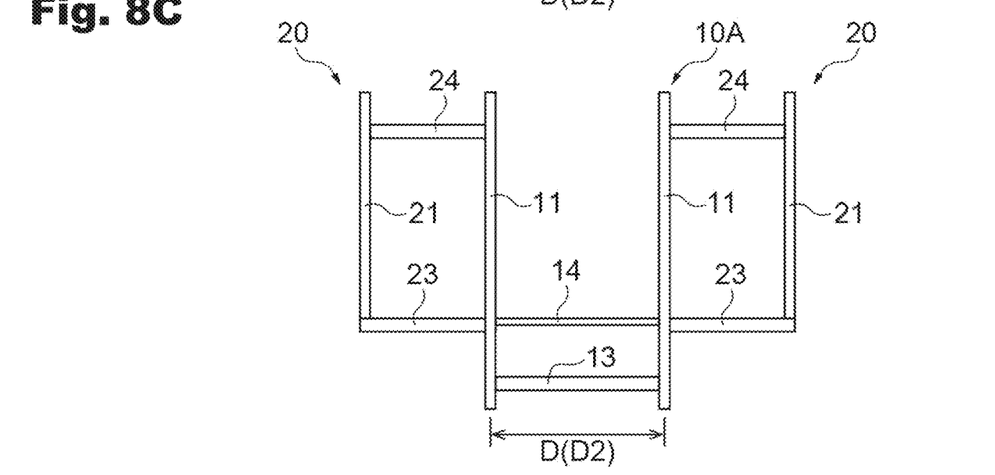

The suspension frame 10 according to the present preferred embodiment is structured so that an additional unit 20 can be selectively attached thereto. The additional unit 20 is able to place a container F along a track 5 beside the track 5. As described above, the additional unit 20 includes the additional shelf supporting portion 23, the additional suspending portion 21, the additional connecting portion 24, and the fall prevention fence 29, and is fixable to at least one suspending portion 11 of the suspension frame 10 as illustrated in FIG. 7A to 7C or to at least one suspending portion 11 of the suspension frame 10A as illustrated in FIGS. 8A to 8C. By adding the additional unit 20 to the suspension frame 10, a container F can be placed along the track 5 beside the track 5.

Shelf modules are selected from a shelf module group including two types the lengths W of which in the longitudinal direction are W1 and that are the second shelf module 40 (see FIG. 4 and FIG. 5) including the purge apparatus 50 and the first shelf module 30 (see FIG. 3) having no purge apparatus 50.

At the site where the storage shelf 1 is installed, suspension frames 10, first shelf modules 30, and second shelf modules 40 selected from the suspension frame group and the shelf module group described above are assembled. To begin with, as illustrated in FIG. 7A, in each suspension frame 10, an additional unit 20 is attached to one of a pair of suspending portions 11, 11. The additional unit 20 is fixed to the suspension frame 10 by screws, for example. The suspension frames 10 to each of which the additional unit 20 is attached are disposed at regular intervals along the traveling direction of overhead traveling vehicles 3 such that the extending direction of the shelf supporting portions 13 extends in a direction (Y-direction) orthogonal to the traveling direction.

Subsequently, each first shelf module 30 (see FIG. 3) selected from the above-described shelf module group is laid over between shelf supporting portions 13 and between additional shelf supporting portions 23 adjacent to each other in the traveling direction. Subsequently, the first shelf module 30 is fixed to the shelf supporting portions 13 and the additional shelf supporting portions 23 by screws 19. The screws 19 are inserted from below into through holes 13a, 23a in the shelf supporting portions 13 or the additional shelf supporting portions 23, and the corresponding first shelf frame 31 is fixed to the shelf supporting portions 13 or the additional shelf supporting portions 23.

Subsequently, each second shelf module 40 (see FIG. 4 and FIG. 5) selected from the above-described shelf module group is laid over between additional shelf supporting portions 23 adjacent to each other in the traveling direction. Subsequently, screws 19 are inserted from below into through holes 23a in the additional shelf supporting portions 23, and the second shelf frame 41 of the second shelf module 40 is fixed to the additional shelf supporting portions 23.

Subsequently, pipes of the second shelf module 40 laid over between the additional shelf supporting portions 23 are connected to the corresponding main pipes 60. Specifically, the pipe connector 56a of the third pipe 56 that communicates with the supply nozzle 51 of each second shelf board 43 via the MFC 55, for example, is connected to the branch portion 61 of the main pipe 60. The cable 72 and the cable 75 of the second shelf module 40 laid over between the additional shelf supporting portions 23 are connected to the corresponding main cable 70. Specifically, the cable connector 72a of the cable 72 connected to the MFC 55 provided on each second shelf board 43 is connected to the branch portion 71 of the main cable 70. The cable 75 connected to the detection unit 59 provided on each second shelf board 43 is connected to the branch portion 71 of the main cable 70. By the above-described steps, installation of the storage shelf 1 is completed.

The following describes functional effects of the storage shelf 1 according to the preferred embodiment described above. The storage shelf 1 according to the preferred embodiment described above is installed by simple steps of disposing the suspension frames 10 at regular intervals along the traveling direction, laying each first shelf module 30 over between shelf supporting portions 13 of adjacent suspension frames 10, and fastening together the shelf supporting portions 13 and the first shelf module 30. The storage shelf 1 is also installed by simple steps of laying each first shelf module 30 or each second shelf module 40 over between additional shelf supporting portions 23 of adjacent suspension frames 10, and fastening together the additional shelf supporting portions 23 and the first shelf module 30 or the second shelf module 40. Consequently, the installation work at the site is facilitated.

A common storage shelf is produced in a plant or the like, and is conveyed to a site or the like, which is large in size and requires transportation costs. In view of this, according to the present preferred embodiment, because the suspension frames 10, the additional units 20, the first shelf modules 30, and the second shelf modules 40 can be packed piecemeal, sizes thereof during transportation can be relatively reduced.

In the storage shelf 1 according to the preferred embodiment described above, the suspension frames 10 can be selected from the suspension frame group including three types in which the lengths D of shelf supporting portions 13 and the lengths H of suspending portions 11 are different from each other. Thus, for example, the storage shelf 1 can be installed along one track 5, the storage shelf 1 can be installed along two tracks 5, 5 that extend side by side, and the storage shelf 1 can be installed along tracks 5 in which these arrangements coexist. Consequently, layout changes after the installation can be performed easily.

In the storage shelf 1 according to the preferred embodiment described above, because the shelf module group includes two types of shelf modules that are the second shelf module 40 (see FIG. 4 and FIG. 5) having the purge apparatus 50 and the first shelf module 30 (see FIG. 3) having no purge apparatus 50, the purge function can be added easily.

To an end of the third pipe 56 provided on each second shelf board 43 of the second shelf module 40 according to the preferred embodiment described above, the pipe connector 56a connectable to the corresponding main pipe 60 to which fluid is supplied from the supply source is provided. Thus, the third pipe 56 from which gas is supplied to the corresponding MFC 55 can be easily connected to the main pipe 60, which facilitates the installation work at the site.

In the storage shelf 1 according to the preferred embodiment described above, the MFC 55 is provided on each of the second shelf boards 43. Thus, as illustrated in FIG. 4 and FIG. 5, even when the second shelf boards 43 including the purge apparatus 50 are provided in plurality, pipes (the first pipes 52, the second pipes 54, and the third pipes 56) can be assembled into the second shelf module 40 in advance, which facilitates the installation work at the site.

To an end of the cable 72 provided on each second shelf board 43 of the second shelf module 40 according to the preferred embodiment described above, the corresponding cable connector 72a is provided as illustrated in FIG. 5. Thus, the cable 72 to connect the corresponding MFC 55 to the purge controller can be easily connected to the corresponding main cable 70, which facilitates the installation work at the site.

In the second shelf module 40 of the storage shelf 1 according to the preferred embodiment described above, as illustrated in FIG. 4, the branch portion 61 being connectable from the main pipe 60 to the third pipe 56 is provided so as to correspond to each second shelf board 43. Thus, the work of attaching the pipe branching off from the main pipe 60 into the third pipe 56 can be performed easily.

Each first shelf module 30 and each second shelf module of the storage shelf 1 according to the present preferred embodiment are fixed to the corresponding shelf supporting portions 13 or the corresponding additional shelf supporting portions 23 by screws 19 inserted from below into the shelf supporting portions 13 or the additional shelf supporting portions 23. In case of production on order in which a storage shelf is manufactured in a plant, for example, in a manner fitting to the dimensions or the like of the site, when a member (hereinafter, referred to as "member A") corresponding to the first shelf module 30 is fastened to members (hereinafter, referred to as "members B") corresponding to the shelf supporting portions 13, screws or the like are inserted from above into through holes of the member A to fasten the member A to the members B in consideration of productivity. By contrast, in the present preferred embodiment, after the suspension frames 10 have been fixed to a fixed structure such as a ceiling in a previous step, work of fixing the first shelf module 30 to the shelf supporting portions 13 or the additional shelf supporting portions 23 or work of fixing the second shelf module 40 to the additional shelf supporting portions 23 is performed. In a state in which the suspension frames 10 have been fixed to the fixed structure such as the ceiling and then the first shelf module 30 (second shelf module 40) has been laid over between the shelf supporting portions 13 (additional shelf supporting portions 23) of the adjacent suspension frames 10, a space for an operator to make access above the first shelf module 30 (second shelf module 40) is limited. Even in this state, in the storage shelf 1 according to the present preferred embodiment, the work of fixing can be performed from below the first shelf module 30 (second shelf module 40). Thus, the installation work at the site is facilitated.

Although preferred embodiments have been described above, the present invention is not limited to the preferred embodiments, and various modifications may be made within the scope not departing from the gist of the present invention.

Figure 9:
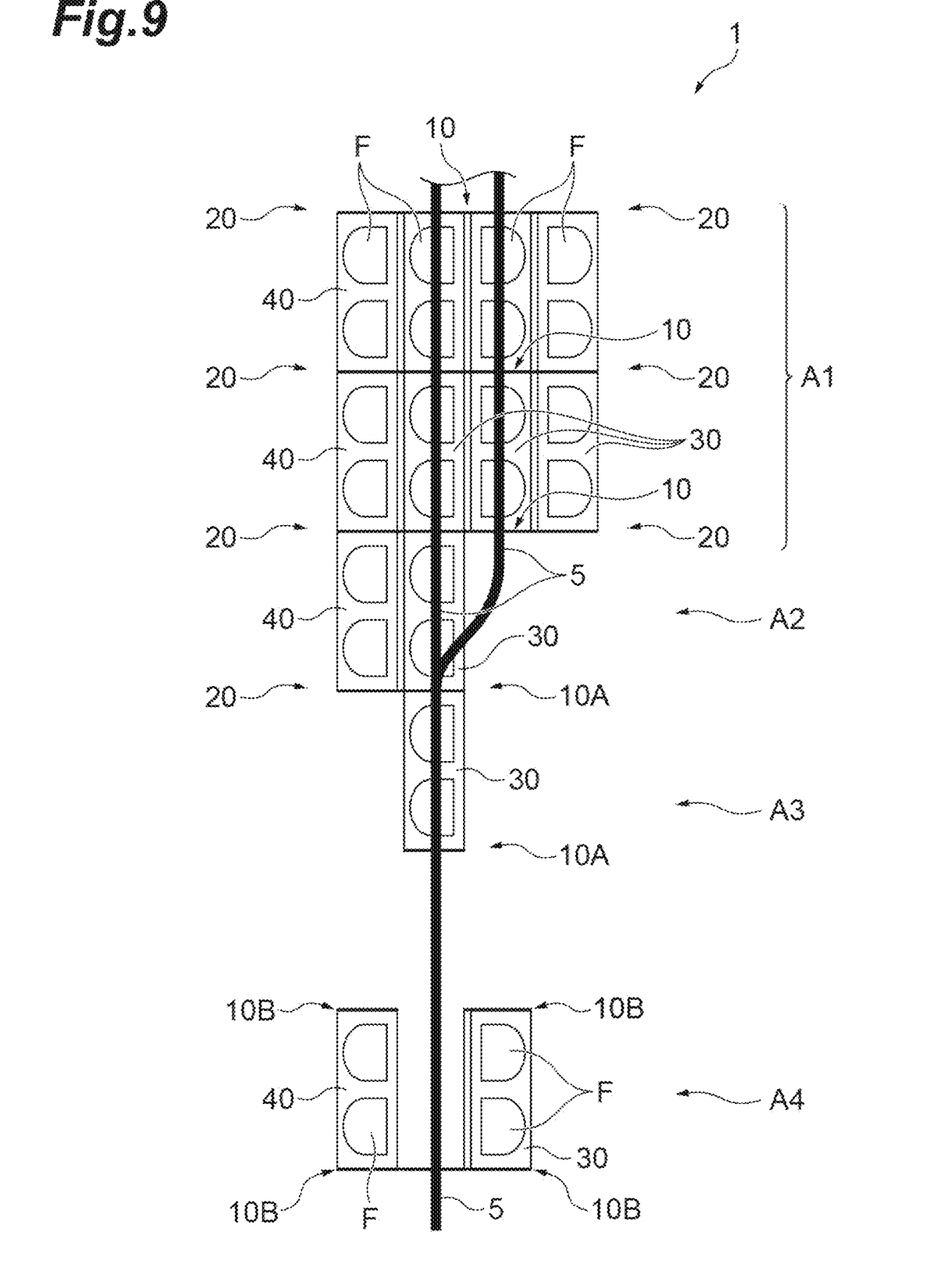
FIG. 9 is a plan view illustrating arrangement patterns of the storage shelf.

In the preferred embodiments, an example has been described in which the storage shelf 1 is disposed in an area where two tracks 5, 5 extend side by side as illustrated in FIG. 1, that is, an area A1 illustrated in FIG. 9. However, the present invention is not limited to this. Herein, FIG. 9 is a plan view illustrating an arrangement pattern of the storage shelf.

For example, like the storage shelf 1 disposed in an area A2 illustrated in FIG. 9, the first shelf modules 30 may be disposed directly below one track 5, and the second shelf modules 40 may be disposed beside the downstream track 5. In this case, from the suspension frame group described in detail, the suspension frame 10 to which the additional unit 20 is attached as illustrated in FIG. 7A, the suspension frame 10A illustrated in FIG. 6B, the first shelf module 30 illustrated in FIG. 3, and the second shelf module 40 illustrated in FIG. 4 and FIG. 5 can be combined to form the storage shelf 1.

For example, like the storage shelf 1 disposed in an area A3 illustrated in FIG. 9, the first shelf modules 30 may be disposed directly below one track 5 along the track 5. In this case, the suspension frame 10A as illustrated in FIG. 6B from the suspension frame group described in detail and the first shelf module 30 illustrated in FIG. 3 can be combined to define the storage shelf 1.

For example, like the storage shelf 1 disposed in an area A4 illustrated in FIG. 9, the first shelf module 30 may be disposed on one side of one track 5, and the second shelf module 40 may be disposed on the other side thereof. In this case, from the suspension frame group described in detail, the suspension frame 10B as illustrated in FIG. 6C, the first shelf module 30 illustrated in FIG. 3, and the second shelf module 40 illustrated in FIG. 4 and FIG. 5 can be combined to form the storage shelf 1.

As described in the foregoing, in the storage shelf 1 according to the present preferred embodiment, by optionally selecting suspension frames and shelf modules from the suspension frame group or the shelf module group described above, for example, the storage shelf 1 can be installed along one track 5, the storage shelf 1 can be installed along two tracks 5, 5 that extend side by side, and the storage shelf 1 can be installed along tracks in which these arrangements coexist. Consequently, layout changes after the installation can be performed easily.

In one of the preferred embodiments, an example has been described in which the fixation portions are fixed to the fixed structure such as the ceiling. However, the present invention is not limited to this. For example, the fixation portions may be fixed to raceways, for example, configured to allow the fixation portions to slide by releasing the fixation.

In the preferred embodiments and the modifications described above, examples have been described in which the main pipe 60 is supported by the pipe support bracket 49 fixed to the second shelf frame 41. However, for example, the main pipe 60 may be supported by a traveling rail along which overhead traveling vehicles travel, may be supported by a supporting structure installed to a ceiling or the like of a clean room, or may be supported directly by the ceiling.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A storage shelf comprising:
   a shelf module including a shelf board on which a container is to be placed, a nozzle to supply fluid into the container placed on the shelf board, a mass flow controller to adjust a flow rate of the fluid supplied from the nozzle, and a pipe connecting between the mass flow controller and a main pipe connected to a supply source of the fluid; and
   suspension frames each including a shelf supporting portion supporting the shelf module from below and a pair of suspending portions suspending and supporting the shelf supporting portion; wherein
   the suspension frames are disposed at regular intervals along one direction;
   the shelf module is laid over between the shelf supporting portions of the suspension frames adjacent to each other in the one direction;
   the shelf module laid over between the shelf supporting portions is fixed to the shelf supporting portions of the suspension frames by bolts or screws inserted from below into through holes in the shelf supporting portions;
   the shelf module includes a shelf frame laid over between the shelf supporting portions of the suspension frames adjacent to each other in the one direction and a plurality of shelf boards attached to the shelf frame; and
   the mass flow controller is provided on each of the shelf boards.

2. The storage shelf according to claim 1, wherein
   the shelf module further includes a cable including a first end connected to each mass flow controller; and
   a second end of the cable is provided with a cable connector being connectable to a main cable connected to a control device.

3. The storage shelf according to claim 1, wherein the shelf module is provided with branch connecting portions each being connectable between the main pipe and the pipe such that a number of the branch connecting portions corresponds to a number of the shelf boards.

4. A storage shelf comprising:
at least one shelf module selected from among two types of shelf modules, lengths of which in an extending direction are the same and types of which are different in presence or absence of a purge function, the at least one shelf module extending along a track for an overhead traveling vehicle to convey a container and on which the container is to be placed; and
a plurality of suspension frames that suspend the at least one shelf module from a fixed structure, the plurality of the suspension frames each including shelf supporting portions supporting the at least one shelf module from below and extending in one direction and a pair of suspending portions extending from both ends of each shelf supporting portion to the fixed structure, the plurality of suspension frames being selected from among a plurality of types of suspension frames, lengths of which in extending directions of the shelf supporting portion and the suspending portions are different from each other; wherein
the plurality of suspension frames are disposed at regular intervals along a traveling direction of the overhead traveling vehicle such that the extending direction of the shelf supporting portion extends in a direction orthogonal to the traveling direction;
the at least one shelf module is laid over between the shelf supporting portions of the plurality of suspension frames adjacent to each other in the traveling direction; and
the at least one shelf module laid over between the shelf supporting portions is fixed to the shelf supporting portions of the plurality of suspension frames by fastening members.

5. A method for installing a storage shelf, the method comprising:
selecting at least one shelf module selected from among two types of shelf modules, lengths of which in an extending direction are the same and types of which are different in presence or absence of a purge function, the at least one shelf module extending along a track for an overhead traveling vehicle to convey a container and on which the container is to be placed;
selecting a plurality of suspension frames that suspend the at least one shelf module from a fixed structure, the plurality of the suspension frames each including shelf supporting portions supporting the at least one shelf module from below and extending in one direction and a pair of suspending portions extending from both ends of each shelf supporting portion to the fixed structure, the plurality of suspension frames being selected from among a plurality of types of suspension frames, lengths of which in extending directions of the shelf supporting portion and the suspending portions are different from each other;
disposing the selected plurality of suspension frames at regular intervals along a traveling direction of the overhead traveling vehicle such that the extending direction of the shelf supporting portion extends in a direction perpendicular or substantially perpendicular to the traveling direction;
laying the selected at least one shelf module over between shelf supporting portions of the plurality of suspension frames adjacent to each other in the traveling direction; and
fixing the at least one shelf module laid over between the shelf supporting portions to the shelf supporting portions of the plurality of suspension frames by fastening members.

6. The storage shelf according to claim 2, wherein the shelf module is provided with branch connecting portions each being connectable between the main pipe and the pipe such that a number of the branch connecting portions corresponds to a number of the shelf boards.

* * * * *